(12) United States Patent
Sandhu et al.

(10) Patent No.: US 8,420,170 B2
(45) Date of Patent: Apr. 16, 2013

(54) METHODS OF FORMING GLASS ON A SUBSTRATE

(75) Inventors: Gurtej S. Sandhu, Boise, ID (US); Ravi Iyer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 85 days.

(21) Appl. No.: 12/843,518

(22) Filed: Jul. 26, 2010

(65) Prior Publication Data

US 2010/0285238 A1    Nov. 11, 2010

Related U.S. Application Data

(60) Division of application No. 11/192,326, filed on Jul. 27, 2005, now Pat. No. 7,763,327, which is a continuation of application No. 08/636,069, filed on Apr. 22, 1996, now abandoned.

(51) Int. Cl.
  *C23C 16/00* (2006.01)

(52) U.S. Cl.
  USPC ............ 427/255.29; 427/255.28; 427/255.38; 427/583; 427/595

(58) Field of Classification Search ............. 427/255.28, 427/255.38, 583, 595, 255.29
See application file for complete search history.

(56) References Cited

U.S. PATENT DOCUMENTS

| | | | |
|---|---|---|---|
| 3,866,083 A | 2/1975 | Datta et al. | |
| 4,371,587 A | 2/1983 | Peters et al. | |
| 4,579,750 A | 4/1986 | Bowen et al. | |
| 4,581,248 A | 4/1986 | Roche | |
| 4,694,777 A | 9/1987 | Roche | |
| 4,782,787 A | 11/1988 | Roche | |
| 4,791,005 A * | 12/1988 | Becker et al. | 427/255.29 |
| 4,910,043 A | 3/1990 | Freeman et al. | |
| 4,916,091 A | 4/1990 | Freeman et al. | |
| 5,000,113 A | 3/1991 | Wang et al. | |
| 5,112,647 A | 5/1992 | Takabayashi | |
| 5,166,101 A | 11/1992 | Lee et al. | |
| 5,192,589 A | 3/1993 | Sandhu | |
| 5,215,787 A | 6/1993 | Homma | |
| 5,246,881 A | 9/1993 | Sandhu et al. | |
| 5,248,636 A | 9/1993 | Davis et al. | |
| 5,252,518 A | 10/1993 | Sandhu et al. | |
| 5,288,518 A * | 2/1994 | Homma | 427/255.29 |
| 5,318,857 A | 6/1994 | Haluska | |
| 5,387,546 A * | 2/1995 | Maeda et al. | 438/784 |
| 5,393,564 A | 2/1995 | Westmoreland et al. | |
| 5,399,379 A | 3/1995 | Sandhu | |
| 5,420,075 A | 5/1995 | Homma et al. | |
| 5,605,867 A | 2/1997 | Sato et al. | |
| 5,633,211 A | 5/1997 | Imai et al. | |
| 5,661,092 A | 8/1997 | Koberstein et al. | |
| 5,710,079 A | 1/1998 | Sukharev | |
| 5,820,942 A | 10/1998 | Singh et al. | |
| 5,962,079 A | 10/1999 | Koberstein et al. | |
| 6,573,199 B2 | 6/2003 | Sandhu et al. | |
| 6,649,218 B2 | 11/2003 | Qian et al. | |
| 6,764,956 B2 | 7/2004 | Sandhu et al. | |
| 6,793,736 B2 | 9/2004 | Sandhu et al. | |
| 7,763,327 B2 | 7/2010 | Sandhu et al. | |
| 2004/0063898 A1 | 4/2004 | Nishinaka et al. | |
| 2004/0074338 A1 | 4/2004 | Kuhn et al. | |
| 2004/0113227 A1 | 6/2004 | Goto et al. | |
| 2006/0029736 A1 | 2/2006 | Sandhu et al. | |

FOREIGN PATENT DOCUMENTS

| | | |
|---|---|---|
| EP | 0562625 | 3/1993 |
| JP | 62-077474 | 4/1987 |
| JP | 01296627 | 11/1989 |
| JP | 2-050966 | 2/1990 |
| JP | 02-050966 | 2/1990 |
| JP | 4-188622 | 7/1992 |
| JP | 04-188622 * | 7/1992 |
| JP | 05-186875 | 7/1993 |
| JP | 06-104181 | 4/1994 |

OTHER PUBLICATIONS

Atkins, Peter, et al., "In: Chemical Principles—The Quest for Insight", W. H. Freeman and Co.: New York, (1999), 616-620.
Harrison, P., "In: Dictionary of Physics", Cassell Academic, London, Definition of "diffract" and "diffraction", (1998), 44-45.
Inoue, K., et al., "Growth of SiO2 Thin Film by Double-excitation Photoinduced Chemical Vapor Deposition Incorporated with Microwave Excitation of Oxygen", J. Appl. Phys., 64, , (Dec. 1, 1988), 6496-6501.
Nara, Yasuo, et al., "Synchroton Radiation-Assisted Silicon Film Growth by Irradiation Parallel to the Substrate", JPN. J. Appl Phys vol. 31, (1992), 2333-2337.
Ohring, M., "In: The Materials Science of Thin Films", Academic Press, Inc., San Diego, (1992), 52-53.
Pierson, H. O., "In: Handbook of Chemical Vapor Deposition (CVD)", Noyes Publications, Park Ridge, NJ, (1992), 26-27.
Sakai, Shigeki, et al., "La5rge area pulsed laser deposition of dielectric and ferroletic thin films", J Vac Sci Technol A 25(4), (2007), 903-907.
Tate, A, et al., "Theoretical and experimental investigations on the deposition rate and processes of parallel incident laser induced CVD", Appl. Phys. A 38, (1985), 221-226.
Tsai, Hung Sheng, et al., "CO2 Laser Assisted Plasma-Enhanced Chemical Vapor Deposition of Silicon Dioxide Thin Film", JPN. J. Appl. Phys, vol. 40 Part 1 No. 5 A, (2001), 3093-3095.

* cited by examiner

*Primary Examiner* — Elizabeth Burkhart
(74) *Attorney, Agent, or Firm* — Schwegman, Lundberg & Woessner, P.A.

(57) ABSTRACT

Disclosed is a deposition process for forming a glass film. An embodiment comprising the steps of disposing a substrate in a chemical vapor deposition chamber and exposing the substrate surface to a $SiO_2$ precursor gas, a carrier gas, and optionally a dopant gas in the presence of ozone and exposing the reaction volume of the gases above the substrate surface to a high intensity light source.

20 Claims, No Drawings

METHODS OF FORMING GLASS ON A SUBSTRATE

This application is a divisional of U.S. application Ser. No. 11/192,326, filed Jul. 27, 2005, now U.S. Pat. No. 7,763,327, which is a Continuation of U.S. application Ser. No. 08/636,069, filed Apr. 22, 1996, now abandoned, which applications are incorporated herein by reference in their entirety.

TECHNICAL FIELD

This invention relates to integrated circuit manufacturing processes and, more specifically, to a novel process using ozone for the chemical vapor deposition of doped and undoped $SiO_2$ films.

BACKGROUND

In order to build an integrated circuit, many active devices need to be fabricated on a single substrate. The current practice in semiconductor manufacturing is to use thin film fabrication techniques. A large variety of materials can be deposited using thin films, including metals, semiconductors, insulators and the like. The composition and uniformity of these thin layers must be strictly controlled to facilitate etching of submicron features. The surface of the substrate, most often a wafer, must be planarized in some way to prevent the surface topography from becoming increasingly rough with each added thin film level. The formation of such films is accomplished by a large variety of techniques.

Chemical vapor deposition (CVD) processes are often selected over competing deposition techniques because they offer numerous advantages, including the ability of CVD to deposit films from a wide variety of chemical compositions.

In general a CVD process includes the following steps: a selected composition and flow rate of reactant and inert gases are dispatched into a reaction chamber; the gases move to the substrate surface; the reactants are adsorbed on the substrate surface; the species undergo a film-forming chemical reaction and the by-products of the reaction are desorbed from the surface and conveyed away from the surface.

The semiconductor industry's continuing drive towards tighter device geometries, has placed an increased demand for cost-effective solutions for the problem of planarization. TEOS-based oxides (tetraethylorthosilicate) have attracted the industry's attention for several years due to the superior film quality they offer over traditional silane-based CVD technologies. The $TEOS/O_3$ processes operating at atmospheric pressures possess markedly superior step coverage and planarization characteristics. The unique high mobility of the low temperature TEOS chemistry provides excellent planarization for sub-half micron geometries. As a result there has been an increased use of TEOS/ozone chemistry. The TEOS is used as a source of silicon to deposit silicon dioxide ($SiO_2$).

$TEOS/O_3$ is almost always deposited via atmospheric pressure chemical vapor deposition (APCVD) or nearly atmospheric pressures, using sub atmospheric chemical vapor deposition (SACVD). TEOS/ozone APCVD possesses a number of desirable characteristics, including: it is capable of sub-half micron void-free gap filling with good planarization, it offers a low deposition temperature, high moisture resistance, low stress, high breakdown voltage, low leakage current and low particle densities.

A TEOS molecule is fairly large and complex, has a low sticking coefficient and yields better step coverage than other silicon sources. It is found that a TEOS molecule can actually move over several microns before it finally settles down to react with the other species. Less reactive ozone ($O_3$), in $TEOS/O_3$ applications, allows even more surface mobility, by permitting the TEOS molecule to move over even longer distances before it reacts.

Other benefits of TEOS/ozone include: flow-like, as-deposited step coverage, lower reflow temperatures with excellent stability, and lower particle counts.

Although ozone based TEOS processes for undoped and doped $SiO_2$ films have been developed for high aspect ratio gapfill applications. One of the major issues facing integration of these films into standard process flows in semiconductor fabrication has to do with large shifts in high frequency capacitance voltage (C-V) flat band voltage due to fixed charge in the films.

The fixed charge is located in the so-called transition region between silicon (Si) and $SiO_2$. These charges are named fixed charges because they do not change their charge state by exchange of mobile carriers with the silicon, as with the interface trap charge. The fixed charge is considered to be a sheet of charge at the $Si/SiO_2$ interface.

The value of the fixed charge is determined by measuring the voltage shift of a high frequency capacitance-voltage (C-V) curve of a MOS capacitor test device. For the case of fixed charge at the interface, the flat-band voltage, of the C-V curve is related to the oxide charge, oxide thickness, and work function difference between the gate electrode and the silicon.

The value of the fixed charge depends on the oxidizing ambient, oxidizing temperature, silicon orientation, cooling rate from elevated temperature, cooling ambient, and subsequent anneal cycles. Although, it is desirable to minimize the value of the fixed charge, current semiconductor manufacturing technologies use ion implantation to control the device threshold voltage, which is the device parameter most impacted by the fixed charge. In spite of the ability to override small variations in the fixed charge, a goal of maintaining a low and reproducible value of the fixed charge is nevertheless still desirable during fabrication.

Fixed charge has generally been related to the presence of residual carbon in the films. It is believed that at higher pressures, due to high molecular collision frequency and increased recombination reactions, the number of oxygen atoms available for reaction is lower than at lower pressures. Any increase in $O_3$ flow/concentration is met by lower life time of the $O_3$ molecule leading to the saturation of atomic concentration of oxygen in the reaction chamber.

For lower pressure processes it has been shown that increasing the process temperature helps lower the fixed charge but this remedy is not totally effective for low pressure processes, such as $TEOS/O_3$ APCVD.

What is still needed is a thin film fabrication process that reduces the fixed charge value in the deposited film.

DETAILED DESCRIPTION

Advantages, objects, and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims. Various embodiments of the present invention provide a CVD method with improved reduction of the fixed charge value in the deposited film.

Various embodiments of the present invention provide a CVD method that provides a functional increase in amount of atomic oxygen available for reaction at the substrate surface.

Various embodiments of the present invention include a process comprising the steps of disposing a substrate in a chemical vapor deposition chamber at atmospheric pressure and exposing the substrate surface to a $SiO_2$ precursor gas, a carrier gas, and optionally a dopant gas in the presence of ozone and exposing the reaction volume of the gases above the substrate surface to a high intensity light source, to reduce the fixed charge in the deposited films.

APCVD ozone ($O_3$) deposition of doped and undoped $SiO_2$ films is carried out in accordance with the present invention in a high temperature, atmospheric pressure, cold wall chemical vapor deposition reactor. In general, the process comprises the steps of disposing a substrate in a chemical vapor deposition chamber and exposing the substrate surface to a $SiO_2$ precursor gas, a carrier gas, and optionally a dopant gas in the presence of ozone and exposing the reaction volume of the gases above the substrate surface to a high intensity light source, to increase the functional atomic oxygen concentration and reduce the fixed charge in the deposited films.

As an example, the deposition of a $SiO_2$ film doped with borophosphosilicate glass (BPSG), using TEOS/$O_3$, will be described in detail. Other examples of doped $SiO_2$ films that can be deposited with this process include fluorosilicate glass (FSG) and FBPSG, both of which would then use FTES (fluorotriethoxysilane) as the $SiO_2$ precursor. A silicon wafer is placed in the vacuum chamber of a cold wall CVD reactor. The separate gases are then fed into the CVD reactor. Helium or other gases can be used as a carrier gas and to regulate the uniformity of the film on the wafer surface. Helium is used as the carrier gas for TEOS and, in the case of the BPSG film, helium is also used as the carrier gas for the dopant sources. An ozonator is used to generate $O_3$ from an $O_2$ stream and the ozone concentration is kept at between 5 and 15 wt/%. The reaction volume of the gases, at or close to the wafer or substrate surface is exposed to a source of light supplied to furnish uniform illumination of the reaction volume. The source of light should be of a high intensity nature and can be supplied by any appropriate source, preferably in the present example, an array of mercury arc vapor lamps positioned to uniformly illuminate the reaction surface of the substrate.

The carrier gas is selected from the group consisting of the noble gases, nitrogen and hydrogen. The preferred carrier gas is a noble gas, with the most preferred gas being helium.

Turning to the $SiO_2$ precursor, the preferred $SiO_2$ precursor is TEOS, but other appropriate precursors may also be used. Examples of other $SiO_2$ precursors that can be used with the CVD ozone process of this invention include TMCTS (tetramethylcyclotetrasiloxane), DES (diethylsilane), DTBS (di-tertiarybutylsilane), and TMOS (tetramethylorthosilicate).

The preferred source for phosphorous for the BPSG dopant is TEPo, but other appropriate precursors may also be used. Examples of other phosphorous precursors that can be used with the CVD ozone process of this invention include TEPi (triethylphosphite), TMPo (trimethylphosphate), and TMPi (trimethylphosphite).

With regards to the boron source for the BPSG dopant, TEB (triethylborate) is preferred, but other appropriate precursors may also be used. Examples of other boron precursors that can be used with the CVD ozone process of this invention include triisopropylborate and TMB (trimethylborate).

The TEOS, TMPo and TEB are delivered to a dispersion head in the chamber using nitrogen bubblers. Bubbling nitrogen through TEOS, TMPo, and TEB forms a gas, which is then combined with ozone just before injection into the dispersion head. The reactants are combined with ozone immediately prior to injection into the dispersion head, this generally helps to ensure formation of highly mobile polysiloxane oligomers necessary for an in-situ flow shape and good dielectric properties.

Other alternatives in place of a bubbler apparatus for supplying the $SiO_2$ and dopant sources are known in the art and may be used; for example heated vapor controlled by a vapor mass flow controller, flash evaporation and direct injection into a mixing chamber.

The selected pressure is 1.0 torr to 760 torr, with 200 Torr being the most preferred. Such conditions are commonly referred to as APCVD.

Representative process conditions are as follows:
Temperature: 200° C. to 700° C., with 480° C. being deemed optimum for integrated circuit manufacture;
Pressure: 200 Torr;
Helium: 2,000 to 8,000 sccm (standard cubic centimeters per minute)
Ozone: 2,000-5,000 sccm;
Ozone: volume % of 5-15%
TEOS: 300-700 mgm
TEB: 100-300 mgm
TEPo: 35-75 mgm.

The reaction volume of the gases that is exposed to optical excitation in this process is meant to describe the volume of gas located within a chemically reactive distance of the substrate. The gas volume located in this vicinity is sometimes described in terms of the type of chemical reaction it tends to undergo. The reactant gases in the reaction volume are referred to as taking part in heterogeneous chemical reactions, rather than homogeneous reactions that take place in the gas volume in the rest of the chamber.

The high intensity light energy source needs to be applied only to the reaction volume and can be supplied by an array of lamps arranged to give uniform illumination of the said volume. It is not necessary to illuminate the gas volume in the rest of the CVD chamber or to illuminate the substrate surface. This process is different from photon-assisted CVD, where it is the substrate reaction surface on which photons are directed to increase reaction rates.

It is believed that optical excitation provided by the high flux light source, such as the mercury arc vapor lamps, to the reaction volume of the gases increases the atomic concentration of oxygen in the gas flux. We believe that the optical excitation of the reaction volume of the gases selectively increases only the concentration of ozone ($O_3$) or free oxygen atoms in the reaction gas mixture and not the concentration of TEOS present. It is believed that this increase in the atomic concentration of oxygen gives rise to a more efficient reaction with less carbon incorporation in the films which in turn will leads to lower fixed charge in the films.

It is widely postulated that in CVD processes involving oxygen, carried out at higher pressures, the number of oxygen atoms available for reaction is lower than at lower pressures, due to high molecular collision frequency and increased recombination reactions. The lower pressures utilized in SACVD is one of the reasons that SACVD TEOS/$O_3$ processes are desirable for thin film deposition in semiconductor manufacture.

The key to optimizing the film's properties seemingly lies in adjusting the amount of ozone added to the process for the underlying film type and deposition temperature. The step coverage, for example, can be changed from isotropic to flow shape by increasing ozone concentration. Also, the deposition rate increases as ozone concentration increases, if the temperature is held constant. However, any increase in $O_3$ flow/concentration in the process conditions is met by lower life time of the $O_3$ molecule leading to the saturation of atomic concentration of oxygen in the reaction chamber. It is believed that the novel process of this invention makes it possible to have a functional increase in available atomic oxygen at the substrate surface, without increasing the $O_3$ concentration in the gas chamber reaction volume in atmospheric pressure CVD applications.

While the preferred embodiment uses this process for the TEOS/$O_3$ APCVD deposition of BPSG, as mentioned above other $SiO_2$ sources can be used with or without dopant sources for the $SiO_2$ film to be deposited. In broader applications of the process of this invention, the application of the high intensity light to the reaction volume could be used with any species of reaction gases in a CVD process. We believe that the process directly causes a short-term overall increase in the number of reactant species available for a CVD reaction.

It will therefore be understood that modifications and variations are possible without departing from the scope of the invention as expressed in the following claims.

We claim:

1. A chemical vapor deposition (CVD) process for depositing borophosphosilicate glass films on a substrate surface, the process comprising:
    disposing the substrate within a chemical vapor deposition reaction chamber;
    heating the substrate to a temperature within a range of at least 480° C. to about 700° C.;
    introducing a gas volume of a $SiO_2$ precursor into the chamber;
    admitting a gas volume of ozone into the chamber;
    admitting a dopant source for phosphorus into the chamber;
    admitting a dopant source for boron into the chamber; and
    exposing a reaction volume of the $SiO_2$ precursor, the ozone, the dopant source for phosphorus, and the dopant source for boron, the reaction volume located above the substrate surface within a chemically reactive distance of the substrate, to a light source without directly exposing the substrate surface to the light source such that borophosphosilicate glass is deposited on the substrate surface.

2. The chemical vapor deposition (CVD) process of claim 1, wherein the reaction chamber maintains a pressure of approximately 200 to 760 torr.

3. The method of claim 2, wherein the $SiO_2$ precursor is selected from the group consisting of TEOS (tetraethylorthosilicate), TMCTS (tetramethylcyclotetrasiloxane), DES (diethylsilane), DTBS (ditertiarybutylsilane), TMOS (tetramethylorthosilicate) and FTES (fluorotriethoxysilane).

4. The method of claim 2, wherein the dopant source for boron is selected from the group consisting of triisopropylborate, TMB (trimethylborate), and TEB (triethylborate), and the dopant source for phosphorus is selected from the group consisting of TEPo (triethylphosphate), TEPi (triethylphosphite), TMPo (trimethylphosphate) and TMPi (trimethylphosphite).

5. The method of claim 1, further comprising introducing a gas volume of a carrier gas into the reaction chamber.

6. The method of claim 5, wherein the dopant source for boron is selected from the group consisting of triisopropylborate, TMB (trimethylborate) and TEB (triethylborate), and the dopant source for phosphorus is selected from the group consisting of TEPo (triethylphosphate), TEPi (triethylphosphite), TMPo (trimethylphosphate) and TMPi (trimethylphosphite).

7. The method of claim 1, wherein the method includes adjusting an amount of ozone admitted such that increasing concentration of free oxygen atoms occurs without increasing ozone concentration in the reaction volume.

8. A method of depositing a borophosphosilicate glass on a substrate surface, comprising:
    heating the substrate surface to a temperature of at least 480° C. to about 700° C.;
    contacting the substrate surface with a reaction volume of gas located above the substrate surface within a chemically reactive distance of the substrate, wherein the reaction volume of gas comprises:
        a $SiO_2$ precursor selected from the group consisting of TEOS (tetraethylortho silicate), TMCTS (tetramethylcyclotetrasiloxane), DES (diethylsilane), DTBS (ditertiarybutylsilane) and TMOS (tetramethylortho silicate);
        a dopant source for boron selected from the group consisting of triisopropylborate, TMB (trimethylborate), and TEB (triethylborate); and
        a dopant source for phosphorus selected from the group consisting of TEPo (triethylphosphate), TEPi (triethylphosphite), TMPo (trimethylphosphate) and TMPi (trimethylphosphite); and
    illuminating the reaction volume of gas from a light source without directly exposing the substrate surface to the light source such that borophosphosilicate glass is deposited on the substrate surface.

9. The method of claim 8, wherein the reaction volume of gas has a pressure of approximately 200 to 760 torr during deposition of the borophosphosilicate glass.

10. A method of depositing a fluoro silicate glass on a substrate surface, comprising:
    heating the substrate surface to a temperature of at least 480° C. to about 700° C.;
    disposing a reaction volume of gas within a chemically reactive distance of the substrate, the reaction volume of gas comprising a fluorinated $SiO_2$ precursor and ozone; and
    illuminating the reaction volume of gas from a light source without directly exposing the substrate surface to the light source such that fluoro silicate glass is deposited on the substrate surface.

11. The method of claim 10, wherein the reaction volume of gas has a pressure of approximately 200 to 760 torr during deposition of the fluoro silicate.

12. The method of claim 10, wherein the method includes adjusting an amount of ozone disposed such that increasing concentration of free oxygen atoms occurs without increasing ozone concentration in the reaction volume.

13. A method of depositing a doped fluoro silicate glass on a substrate surface, the method comprising:
    heating the substrate surface to a temperature of at least 480° C. to about 700° C.;
    contacting the substrate surface with a reaction volume of gas located above the substrate surface within a chemically reactive distance of the substrate, the reaction volume of gas comprising a fluorinated $SiO_2$ precursor, ozone and at least one dopant source; and
    illuminating the reaction volume of gas from a light source without directly exposing the substrate surface to the light source such that doped fluoro silicate glass is deposited on the substrate surface.

14. The method of claim 13, wherein the reaction volume of gas has a pressure of approximately 200 to 760 ton during deposition of the doped fluorosilicate glass.

15. A method of depositing a fluoroborophosphosilicate glass on a substrate surface, the method comprising:
   heating the substrate surface to a temperature of at least 480° C. to about 700° C.;
   contacting the substrate surface with a reaction volume of gas located above the substrate surface within a chemically reactive distance of the substrate, wherein the reaction volume of gas comprises:
      a $SiO_2$ precursor comprising FTES (fluorotriethoxysilane);
      a dopant source for boron selected from the group consisting of triisopropylborate, TMB (trimethylborate), and TEB (triethylborate); and
      a dopant source for phosphorus selected from the group consisting of TEPo (triethylphosphate), TEPi (triethylphosphite), TMPo (trimethylphosphate) and TMPi (trimethylphosphite); and
   illuminating the reaction volume of gas from a light source without directly exposing the substrate surface to the light source such that fluoroborophosphosilicate glass is deposited on the substrate surface.

16. The method of claim 15, wherein the reaction volume of gas has a pressure of approximately 200 to 760 torr during deposition of the fluoroborophosphosilicate.

17. The method of claim 15, wherein the method includes adjusting an amount of ozone in the reaction volume such that increasing concentration of free oxygen atoms occurs without increasing ozone concentration in the reaction.

18. A method of forming a glass film on a substrate surface, the method comprising:
   heating the substrate to a temperature within a range of at least 480° C. to about 700° C.;
   introducing a gas volume of a precursor into the chamber, the gas volume including SiO2;
   introducing a source gas having one of more elements other than silicon to form a borophosphosilicate glass, a fluorosilicate glass, or a fluoroborophosphosilicate glass; and
   exposing a reaction volume of gases to a light without directly exposing the substrate surface to the light such that the borophosphosilicate glass, the fluorosilicate glass, or the fluoroborophosphosilicate glass is deposited on the substrate surface.

19. The method of claim 18, wherein the method includes admitting a gas volume of ozone into the chamber and exposing the ozone to the light.

20. The method of claim 19, wherein the method includes adjusting an amount of ozone admitted such that increasing concentration of free oxygen atoms occurs without increasing ozone concentration in the reaction volume.

* * * * *

UNITED STATES PATENT AND TRADEMARK OFFICE
CERTIFICATE OF CORRECTION

PATENT NO. : 8,420,170 B2  Page 1 of 2
APPLICATION NO. : 12/843518
DATED : April 16, 2013
INVENTOR(S) : Gurtej S. Sandhu et al.

It is certified that error appears in the above-identified patent and that said Letters Patent is hereby corrected as shown below:

On the Title Page:

Item (56), under "Other Publications", column 2, line 5, delete "SiO2" and insert -- $SiO_2$ --, therefor.

Item (56), under "Other Publications", column 2, line 9, delete ""Synchroton" and insert -- "Synchrotron --, therefor.

Item (56), under "Other Publications", column 2, line 16, delete ""La5rge" and insert -- "Large --, therefor.

Item (56), under "Other Publications", column 2, line 17, delete "ferroletic" and insert -- ferroelectric --, therefor.

In the Claims:

In column 6, line 18, in Claim 8, delete "(tetraethylortho silicate)," and insert -- (tetraethylorthosilicate), --, therefor.

In column 6, lines 20-21, in Claim 8, delete "(tetramethylortho silicate);" and insert -- (tetramethylorthosilicate); --, therefor.

In column 6, line 36, in Claim 10, delete "fluoro silicate" and insert -- fluorosilicate --, therefor.

In column 6, line 46, in Claim 10, delete "fluoro silicate" and insert -- fluorosilicate --, therefor.

In column 6, line 50, in Claim 11, delete "fluoro silicate." and insert -- fluorosilicate. --, therefor.

Signed and Sealed this
Eighteenth Day of June, 2013

Teresa Stanek Rea
*Acting Director of the United States Patent and Trademark Office*

CERTIFICATE OF CORRECTION (continued)
U.S. Pat. No. 8,420,170 B2

In column 6, line 55, in Claim 13, delete "fluoro silicate" and insert -- fluorosilicate --, therefor.

In column 6, line 66, in Claim 13, delete "fluoro silicate" and insert -- fluorosilicate --, therefor.

In column 8, line 10, in Claim 18, delete "SiO2;" and insert -- $SiO_2$; --, therefor.

In column 8, line 11, in Claim 18, delete "one of more" and insert -- one or more --, therefor.